(12) United States Patent
Fujiwara et al.

(10) Patent No.: US 9,873,141 B2
(45) Date of Patent: Jan. 23, 2018

(54) FILLER LAYER FORMING METHOD

(71) Applicant: SCREEN Holdings Co., Ltd., Kyoto (JP)

(72) Inventors: Naozumi Fujiwara, Kyoto (JP); Naoko Yamaguchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/148,369

(22) Filed: May 6, 2016

(65) Prior Publication Data

US 2016/0336169 A1 Nov. 17, 2016

(30) Foreign Application Priority Data

May 15, 2015 (JP) ................................. P2015-99566

(51) Int. Cl.
| | | |
|---|---|---|
| *B08B 3/00* | (2006.01) | |
| *B08B 7/00* | (2006.01) | |
| *H01L 21/02* | (2006.01) | |
| *B08B 3/08* | (2006.01) | |
| *B08B 3/02* | (2006.01) | |
| *H01L 21/67* | (2006.01) | |

(52) U.S. Cl.
CPC .............. *B08B 7/0071* (2013.01); *B08B 3/02* (2013.01); *B08B 3/08* (2013.01); *H01L 21/02057* (2013.01); *H01L 21/6715* (2013.01); *H01L 21/67051* (2013.01)

(58) Field of Classification Search
CPC ........... H01L 21/6715; H01L 21/02057; H01L 21/67051; B08B 3/02; B08B 3/08; B08B 7/00

See application file for complete search history.

(56) References Cited

U.S. PATENT DOCUMENTS

| | | | |
|---|---|---|---|
| 7,694,858 B2 | 4/2010 | Takeda et al. ................ | 222/424 |
| 7,934,816 B2 | 5/2011 | Tsukahara et al. ............ | 347/85 |
| 2005/0051930 A1* | 3/2005 | Kawakami .......... | B81C 1/00841 264/341 |
| 2011/0269304 A1 | 11/2011 | Kim et al. .................... | 438/591 |
| 2013/0074764 A1* | 3/2013 | Ishihara .............. | H01L 21/6715 118/66 |

FOREIGN PATENT DOCUMENTS

| | | |
|---|---|---|
| JP | 2011-124313 | 6/2011 |
| JP | 2013-258272 | 12/2013 |
| KR | 10-2008-0012635 | 2/2008 |
| KR | 10-2011-0121360 | 11/2011 |

* cited by examiner

*Primary Examiner* — Alexander Markoff
(74) *Attorney, Agent, or Firm* — Ostrolenk Faber LLP (57) ABSTRACT

A large number of pattern elements stands upright on an upper surface of a substrate. After the upper surface of the substrate has been processed using a processing liquid, liquid filling processing for filling the upper surface with a filler solution is performed, in which the filler solution having a viscosity of three centipoises or more is applied to a central part of the upper surface. Then, by rotating the substrate at 1000 revolutions per minute or less, the processing solution adhering to the entire upper surface is replaced by the filler solution, and a solution layer of a predetermined thickness is formed. In this way, making the viscosity of the filler solution relatively high and making the centrifugal force acting at the time of rotating the substrate relatively low suppresses deformation of the pattern elements at the time of filling with a filler that uses the filler solution.

14 Claims, 7 Drawing Sheets

FILLER LAYER FORMING METHOD

TECHNICAL FIELD

The present invention relates to a liquid filling method for filling a main surface of a substrate having a pattern with a filler solution after the main surface has been processed using a processing liquid.

BACKGROUND ART

A manufacturing process for manufacturing semiconductor substrates (hereinafter, simply referred to as "substrates") conventionally involves various types of processing that is performed on the substrates by substrate processing apparatuses. For example, processing such as etching is performed on a surface of a substrate having a resist pattern on its surface by supplying a chemical liquid to the substrate. After the supply of the chemical liquid, other processing is further performed, such as rinse processing for supplying pure water to the substrate to remove the chemical liquid on the surface and dry processing for removing the pure water on the surface by rotating the substrate at high speed.

When rinse processing using pure water and dry processing are performed in this order on a substrate having a large number of fine pattern elements on its surface, a liquid level of pure water is formed between each two adjacent pattern elements in the course of drying. In this case, the surface tension of the pure water acts on the pattern elements and may collapse the pattern elements. In view of this, Japanese Patent Application Laid-Open No. 2011-124313 discloses a technique for replacing a rinse liquid that remains in recessed portions formed between circuit patterns of a substrate with a filler (polymer) to fill the recessed portions with the filler and solidify the filler, and then removing the filler from the surface of the substrate by plasma processing. Japanese Patent Application Laid-Open No. 2013-258272 discloses a technique for replacing a rinse liquid that adheres to the surface of a substrate having a raised shape pattern with a solution made by dissolving a solute in a solvent, then vaporizing the solvent to precipitate the solute on the surface of the substrate, and then subliming the precipitated solute.

When a water-based polymer solution, for example, is used as a filler solution in the technique (also called "Sacrificial Polymer Fill (SPF)") for filling spaces between a large number of pattern elements with a filler solution and subliming the solidified filler by dry etching or other techniques as described above, there is no flash point and thus a high level of safety is ensured. Also, a polymer that is dispersed to the surroundings can be readily cleaned with water when the polymer solution is applied to the substrate, and therefore it is possible to ensure ease of maintenance and suppress the manufacturing cost of devices.

The above techniques use a filler solution with a relatively low viscosity in order to allow a filler to diffuse under its own weight into spaces between pattern elements. Also, in order to improve the throughput of dry etching, substrates are rotated at, for example, relatively high revolutions per minute (rpm) such as 1500 rpm after the supply of the filler solution to the substrates, and therefore the filler solution is spun off and the thickness of a layer of the filler solution is reduced. However, deformation of pattern elements may occur in the above processing. Such deformation of pattern elements is particularly evident in the case of using a water-based polymer solution with a high surface tension.

SUMMARY OF INVENTION

The present invention is intended for a liquid filling method for filling a main surface of a substrate having a pattern with a filler solution after the main surface has been processed using a processing liquid, and it is an object of the present invention to suppress deformation of pattern elements in the filling with a filler that uses a filler solution.

A liquid filling method according to the present invention includes a) applying a filler solution having a viscosity of three centipoises or more to a central part of a main surface of a substrate, the main surface having a large number of pattern elements that stand upright, and b) replacing a processing liquid that adheres to an entirety of the main surface with the filler solution and forming a solution layer of a predetermined thickness by rotating the substrate at V revolutions per minute or less, where V is a value obtained by multiplying a square root of (150/r) by 1000 and r is a radius of the substrate in millimeters.

According to the present invention, deformation of pattern elements in the filling with a filler that uses a filler solution can be suppressed.

In one aspect of the present invention, the filler solution contains water as a solvent.

In another aspect of the present invention, the filler solution contains a surface tension reducing agent.

In this case, the surface tension reducing agent is preferably isopropyl alcohol.

In one preferred embodiment of the present invention, the filler solution has a viscosity of 15 centipoises or less.

In another preferred embodiment of the present invention, the number of revolutions of the substrate in the operation b) is 300 revolutions per minute or more.

Preferably, tip ends of pattern elements that are adjacent to each other among the large number of pattern elements are coupled to each other by a bridge that extends along the main surface.

Another liquid filling method according to the present invention includes a) applying a filler solution to a central part of a main surface of a substrate, the main surface having a large number of patter elements that stand upright, and b) replacing a processing liquid that adheres to an entirety of the main surface with the filler solution and forming a solution layer of a predetermined thickness by rotating the substrate. A viscosity of the filler solution applied in the operation a) and a number of revolutions of the substrate in the operation b) are set to conditions that suppress occurrence of a void in the solution layer that has been solidified.

These and other objects, features, aspects and advantages of the present invention will become more apparent from the following detailed description of the present invention when taken in conjunction with the accompanying drawings.

DESCRIPTION OF EMBODIMENTS

Figure 1:
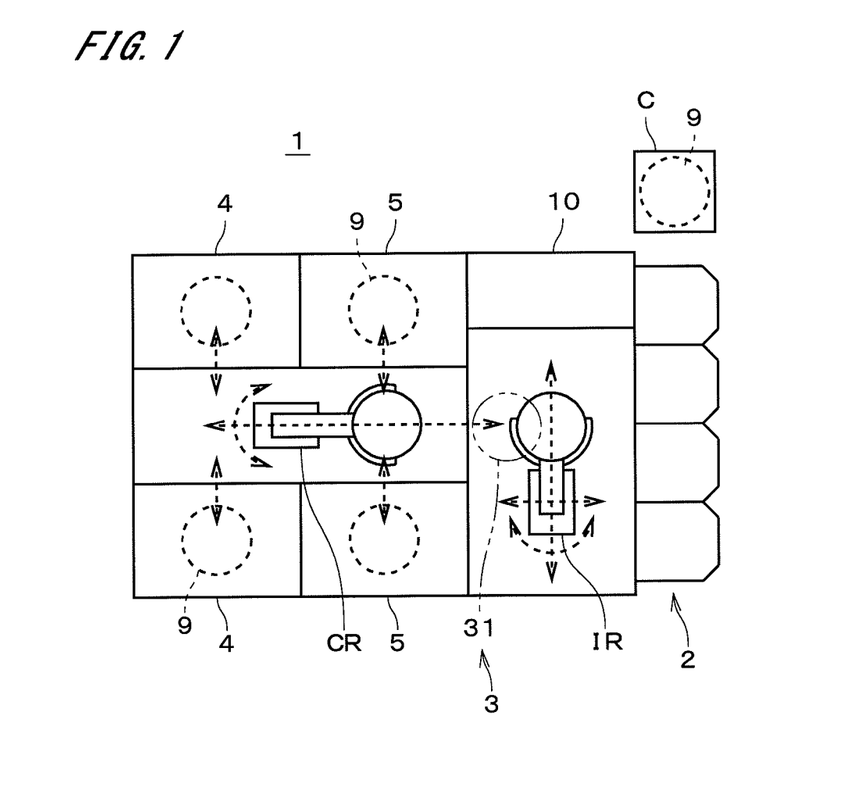
FIG. 1 is a plan view of a configuration of a substrate processing apparatus.

FIG. 1 is a plan view of a configuration of a substrate processing apparatus 1 according to an embodiment of the present invention. The substrate processing apparatus 1 includes a carrier holder 2, a substrate transfer part 3, an indexer robot IR, a center robot CR, two cleaning units 4, two heat treatment units 5, and a controller 10.

A carrier C is a container capable of housing a plurality of substrates 9 in layers. The carrier C houses unprocessed substrates 9 or processed substrates 9. The substrates 9 of the present embodiment have a disc-like shape and a diameter of 300 millimeters (mm). The carrier holder 2 supports a plurality of carriers C.

As conceptually illustrated by broken-line arrows in FIG. 1, the indexer robot IR is capable of conveying a substrate 9 to an arbitrary position by using arms that are pivotable and movable in forward and backward directions while holding a substrate 9. The indexer robot IR is also movable in the up-down direction while holding a substrate 9. Unprocessed substrates 9 in the carriers C disposed in the carrier holder 2 are conveyed to a path 31 of the substrate transfer part 3 by the indexer robot IR. The path 31 functions as a buffer that temporarily stores a plurality of substrates 9. A processed substrate 9 placed on the path 31 is conveyed by the indexer robot IR into a carrier C disposed in the carrier holder 2. For convenience of illustration, the path 31 is indicated by a dashed double-dotted line in FIG. 1.

The center robot CR is capable of conveying a substrate 9 to an arbitrary position by using arms that are pivotable and movable in forward and backward directions while holding a substrate 9. Through this operation, the center robot CR conveys substrates 9 between the path 31 of the substrate transfer part 3, the cleaning units 4, and the heat treatment units 5.

The heat treatment units 5 each include, for example, a hot plate. A substrate 9 that has been subjected to processing in a cleaning unit 4, which will be described later, is placed on the hot plate by the center robot CR. The substrate 9 is thereby heated to a predetermined temperature. The heating of the substrates 9 in the heat treatment units 5 may be implemented by other methods such as infrared-ray radiation using ramps or the application of warm air.

Figure 2:
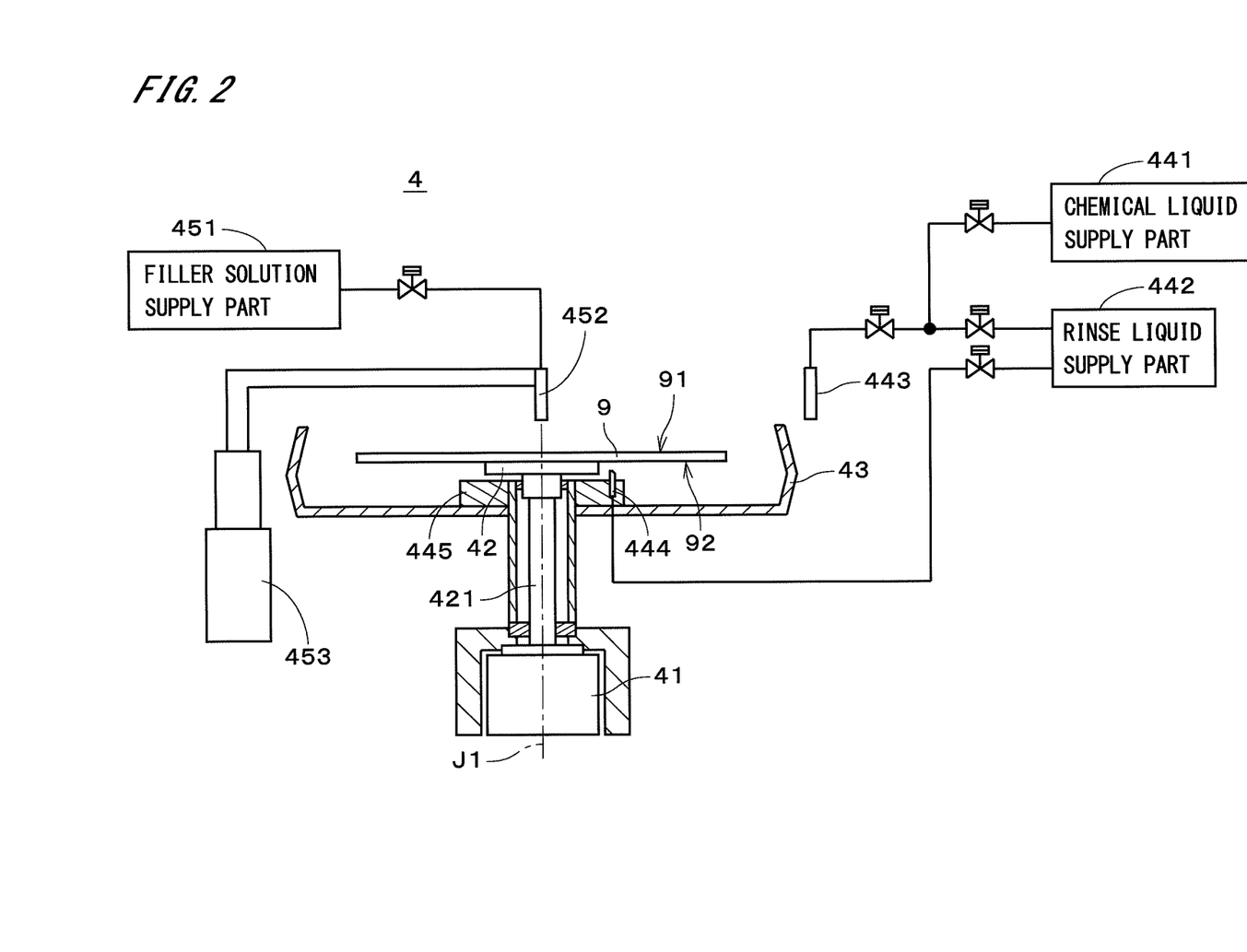
FIG. 2 illustrates a configuration of a cleaning unit.

FIG. 2 illustrates a configuration of a cleaning unit 4. The cleaning unit 4 includes a spin chunk 42 that is a substrate holder, a spin motor 41 that is a substrate rotation mechanism, and a cup 43 that surrounds the spin chunk 42. An unprocessed substrate 9 transferred from the center robot CR is placed on the spin chunk 42. The spin chunk 42 has a plurality of suction holes (not shown) in its upper surface, and a lower surface 92 of the substrate 9 that is one main surface is adsorbed by the suction holes. The substrate 9 is thus held in a horizontal position by the spin chunk 42. The lower surface of the spin chunk 42 is connected to a shaft 421 that extends in the up-down direction (vertical direction). A central axis J1 of the shaft 421 passes through the center of the substrate 9. The spin motor 41 rotates the shaft 421, and accordingly the spin chunk 42 and the substrate 9 rotate about the central axis J1. Note that the configuration of the spin chunk 42 is not limited to adsorbing the back surface of the substrate 9 and, for example, may have a structure in which a plurality of catch-and-hold members are brought into contact with the outer edge of a substrate 9 to catch and hold the substrate 9.

The cleaning unit 4 further includes a chemical liquid supply part 441, a rinse liquid supply part 442, a first nozzle 443, a lower nozzle 444, a filler solution supply part 451, a second nozzle 452, and a second nozzle movement mechanism 453. The filler solution supply part 451 is connected via a valve to the second nozzle 452. The chemical liquid supply part 441 is connected via a valve to the first nozzle 443. The rinse liquid supply part 442 is connected via a valve to the first nozzle 443. The rinse liquid supply part 442 is also connected via a valve to the lower nozzle 444.

The second nozzle movement mechanism 453 disposes the second nozzle 452 selectively at either an opposing position that opposes the upper surface 91 (the other main surface) of the substrate 9 or a standby position that is spaced from the substrate 9 in the horizontal direction. The first nozzle 443 is also disposed selectively at either an opposing position that opposes the upper surface 91 of the substrate 9 and another standby position that is spaced from the substrate 9 in the horizontal direction by a first nozzle movement mechanism (not shown). The lower nozzle 444 is attached to a support pedestal 445 located below the spin chunk 42.

Figure 3:
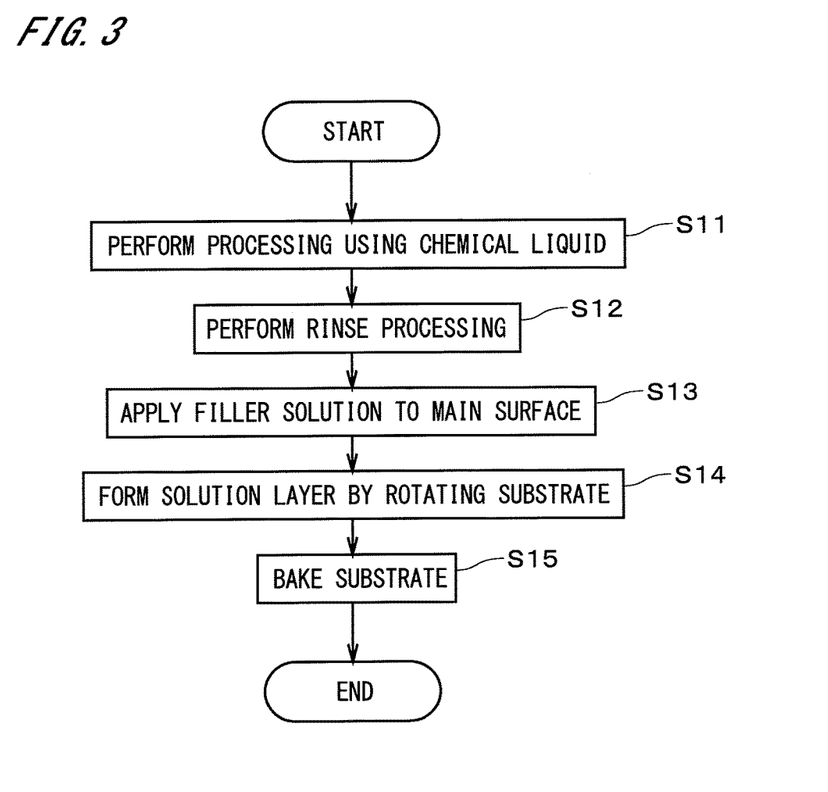
FIG. 3 is a flowchart of processing performed on a substrate.

FIG. 3 is a flowchart of processing performed on a substrate 9 by the substrate processing apparatus 1. First, an unprocessed substrate 9 in a carrier C is conveyed into a cleaning unit 4 by the indexer robot IR and the center robot CR. In the cleaning unit 4, the lower surface 92 of the substrate 9 is held by the spin chunk 42, with the upper surface 91 of the substrate 9 facing upward.

Figure 4:
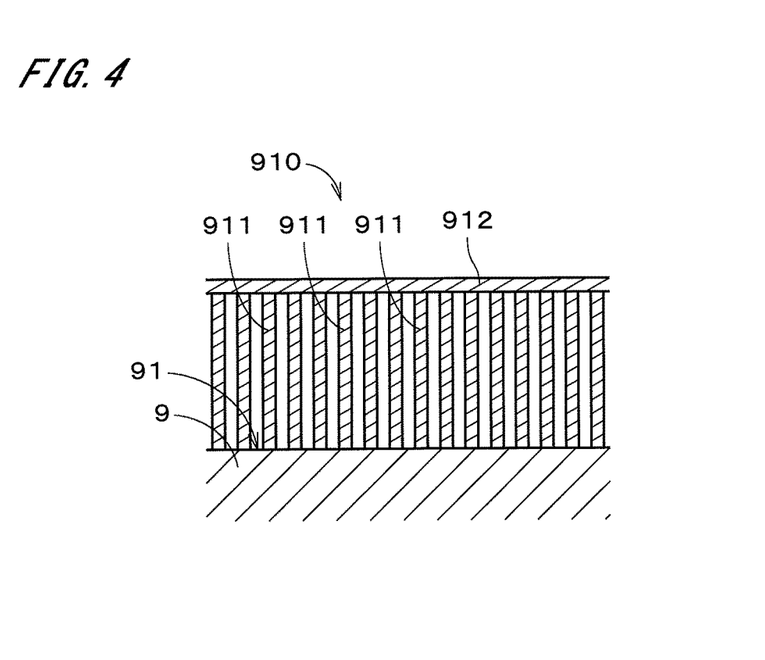
FIG. 4 illustrates a pattern on a substrate.

Here, the upper surface 91 of the substrate 9 has a pattern 910 formed thereon as illustrated in FIG. 4. The pattern 910 includes a large number of pattern elements 911 and a plurality of bridges 912. Each pattern element 911 has a pillar shape that stands upright on the upper surface 91. The substrate 9 is used in manufacturing a memory having a pillar structure. For example, the pattern elements 911 have a height of 1.3 micrometers (μm) and a width of 45 nanometers (nm). The pattern elements 911 have an aspect ratio of 30. The interval between pattern elements 911 that are adjacent to each other is 45 nm. Each bridge 912 extends along the upper surface 91. In FIG. 4, a plurality of bridges 912 extending in the lateral direction are arranged in a direction perpendicular to the plane of the drawing. In the pattern 910, the tip ends of pattern elements 911 that are adjacent to one another in the lateral direction among the large number of pattern elements 911 are coupled to one another by one bridge 912.

In the cleaning unit 4 in FIG. 2, processing using a chemical liquid is first performed on the upper surface 91 of the substrate 9 (step S11). In the processing using a chemical liquid, the first nozzle 443 is first disposed at the opposing position that opposes the upper surface 91 of the substrate 9 by the first nozzle movement mechanism. Also, the spin motor 41 starts rotating the substrate 9 at a predetermined number of revolutions (rotation speed). Then, a chemical liquid is continuously supplied through the first nozzle 443 to the upper surface 91 by the chemical liquid supply part 441. The chemical liquid that is dispersed from the upper surface 91 of the rotating substrate 9 is received and recovered by the cup 43. The chemical liquid may, for example, be a cleaning liquid that contains dilute hydrofluoric acid (DHF) or ammonia water. The supply of the chemical liquid continues for a predetermined period of time. Note that in the processing using the chemical liquid and processing using a rinse liquid which will be described later, the first nozzle 443 may be caused to oscillate horizontally by the first nozzle movement mechanism.

After the processing using the chemical liquid is completed, a rinse liquid is supplied through the first nozzle 443 to the upper surface 91 by the rinse liquid supply part 442 (step S12). The rinse liquid may, for example, be pure water (deionized water). In the rinse processing using the rinse liquid, for example, two liters of the rinse liquid per minute is continuously supplied to the upper surface 91, and the number of revolutions of the substrate 9 is set to 1200 revolutions per minute (1200 rpm). The supply of the rinse liquid continues for a predetermined period of time and then stops. The first nozzle 443 is moved to the standby position by the first nozzle movement mechanism.

After the supply of the rinse liquid has stopped, it is preferable for the substrate 9 to continue to rotate at 800 rpm for five seconds to spin off the rinse liquid. This reduces the thickness of a liquid membrane of the rinse liquid that is formed across the entire upper surface 91 of the substrate 9, i.e., the amount of the rinse liquid remaining on the upper surface 91, while retaining the liquid membrane. The amount of the rinse liquid remaining on the upper surface 91 may, for example, be 0.1 milliliters (ml). Note that the rinse liquid may also be supplied through the lower nozzle 444 to the lower surface 92 by the rinse liquid supply part 442 in parallel with steps S11 and S12.

After the processing using processing liquids including the chemical liquid and the rinse liquid is completed, the second nozzle 452 is disposed at the opposing position that opposes the central part of the upper surface 91 of the substrate 9 by the second nozzle movement mechanism 453. Then, a predetermined amount (e.g., 10 ml) of a filler solution at room temperature is applied through the second nozzle 452 to the central part of the upper surface 91 by the filler solution supply part 451 (step S13). In the present embodiment, the processing in step S13 and processing in step S14 (described later) are performed in a room temperature environment.

The number of revolutions of the substrate 9 when applying the filler solution may, for example, be 100 rpm, and it is preferable for the substrate 9 to continue to rotate at that number of revolutions for a predetermined period of time (e.g., 60 seconds) after the application of the filler solution is completed. This allows the filler solution on the upper surface 91 to spread to some extent from the central part to the outer periphery and enter the spaces between pattern elements 911 that are adjacent to one another. Alternatively, the filler solution may be applied to the upper surface 91 with the rotation of the substrate 9 stopped, and then the rotation of the substrate 9 may be started. The amount of the filler solution applied to the upper surface 91 is not particularly limited as long as it is greater than or equal to the amount (e.g., 5 ml or more) that can cover the entire upper surface 91 in step S14 described later, but from the viewpoint of reducing the cost involved in processing the substrate 9, the amount of the filler solution is preferably small.

Here, the details of the filler solution will be described. The filler solution in the present embodiment is a solution made by dissolving a filler that is a polymer such as an acrylic resin in water. The viscosity of the filler solution increases as the concentration of the filler in the filler solution increases. The concentration of the filler solution is adjusted to 10 weight percent (wt %) or more, and accordingly the viscosity of the filler solution at room temperature is 3 centipoises (cP) (0.003 pascal seconds) or more. The viscosity of the filler solution is preferably 15 cP or less, and in this case, the concentration of the filler solution is adjusted to 32 wt % or less. In the present embodiment, the viscosity of the filler solution is 7.5 cP. A preferable numerical range of the viscosity of the filler solution will be described later in detail. The solvent in the filler solution may be alcohol, instead of water. The filler has solubility to water or alcohol and causes, for example, a crosslinking reaction when heated to a predetermined temperature or more.

Figure 5:
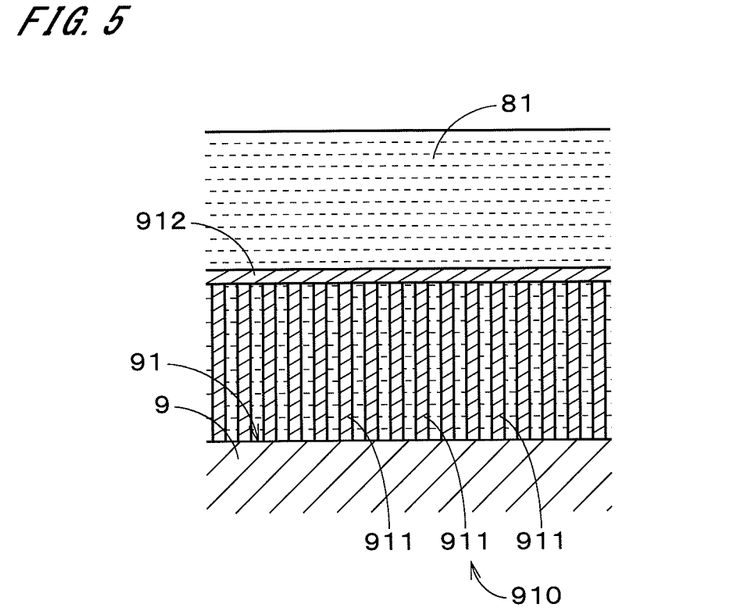
FIG. 5 illustrates a pattern and a solution layer on a substrate.

Next, the number of revolutions of the substrate 9 is increased, and the substrate 9 is rotated at a higher number of revolutions than when applying the filler solution for a predetermined period of time (step S14). This rotation causes the filler solution adhering to the central part of the upper surface 91 to spread across the entire upper surface 91. The filler solution also fills the spaces between pattern elements 911 that are adjacent to one another on the upper surface 91. In this way, the rinse liquid adhering to the entire upper surface 91 of the substrate 9 is replaced by the filler solution, and a layer 81 of the filler solution (hereinafter, referred to as a "solution layer 81") of a predetermined thickness is formed across the entire upper surface 91 as illustrated in FIG. 5. At this time, the filler solution is also spun off to reduce the thickness of the solution layer 81 to some extent. In step S14, it is preferable for the rinse liquid supply part 442 to supply the rinse liquid through the lower nozzle 444 to the lower surface 92, in parallel with the rotation of the substrate 9. This prevents the filler solution from flowing around to the lower surface 92 side.

The number of revolutions of the substrate 9 in step S14 is set to 1000 rpm or less. In one exemplary processing, the substrate 9 continues to be rotated at 300 rpm for 90 seconds. In another exemplary processing, the substrate 9 continues to be rotated at 500 rpm for 30 seconds. In yet another exemplary processing, the substrate 9 continues to be rotated at 800 rpm for 10 seconds. A preferable numerical range of the number of revolutions of the substrate 9 will be described later in detail.

When the rotation of the substrate 9 has stopped, the substrate 9 is conveyed out of the cleaning unit 4 by the center robot CR in FIG. 1 and then conveyed into a heat treatment unit 5. In the heat treatment unit 5, the substrate 9 is heated at 120° C. for one minute, for example. That is, the substrate 9 is baked (step S15), the solvent component (here, water) of the solution layer 81 is removed, and the filler hardens (solidifies).

Thereafter, the substrate 9 is conveyed out of the heat treatment unit 5 by the center robot CR and returned into the carrier C by the indexer robot IR. This completes the processing performed on the substrate 9 by the substrate processing apparatus 1.

The substrate 9 with the spaces between adjacent pattern elements 911 filled with the solidified filler is conveyed to an external dry etching apparatus. Then, the filler is removed by dry etching. At this time, since the interposition (filler) between adjacent pattern elements 911 is a solid, the filler is removed in a state in which the surface tension of the interposition does not act on the pattern elements 911. The above-described processing in steps S13 to S15 and the processing for removing the filler may be regarded as processing for drying the rinse liquid adhering to the upper surface 91, and this dry processing prevents the pattern elements from becoming deformed due to the surface tension of the rinse liquid that is being dried. The removal of the filler may be performed by other methods that do not use any liquid. For example, depending on the type of the filler, the filler may be removed by heating the filler under a reduced pressure to sublime the filler.

Figure 6:
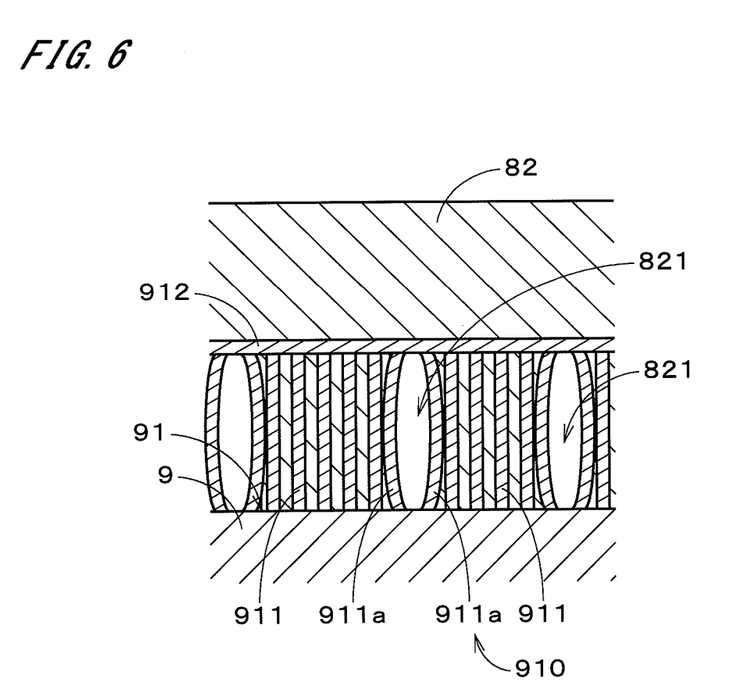
FIG. 6 illustrates a pattern and a filler layer on a substrate.

Next, processing according to a comparative example will be described, in which the viscosity of the filler solution applied to the substrate 9 in step S13 is less than 3 cP or the number of revolutions of the substrate 9 in step S14 is greater than 1000 rpm. In the processing of the comparative example, as illustrated in FIG. 6, voids 821 that are filler-less parts may be generated in a solution layer 82 (i.e., a layer of the filler and hereinafter referred to as a "filler layer 82") that is solidified by the baking of the substrate 9 in step S15, and in this case, pattern elements become deformed at the locations where the voids 821 are generated. In FIG. 6, deformed pattern elements are denoted by 911a. In the example in FIG. 6, the amount of deformation in the vicinity of the centers of the pattern elements 911a is large due to the presence of the bridges 912.

Although the cause of generation of the voids 821 in the filler layer 82 is not clear, it is considered that at the time of rotating the substrate 9 in step S14, minute areas where there is no filler solution (these areas can also be regarded as the base of the voids 821) are generated by centrifugal force in the (semi-dried) solution layer 81 from which water has been reduced to some extent, and these areas are increased into observable voids 821 by the baking of the substrate 9 in step S15. At this time, the pattern elements 911a become deformed under the influence of the surface tension of the filler solution that has not yet solidified.

Table 1 shows a relationship between the viscosity of the filler solution applied to the substrate 9 in step S13, the number of revolutions of the substrate 9 in step S14, and the density of the voids 821 generated in the filler layer 82. The void density indicates the number of voids 821 observable in the range of 1 μm in a direction along the upper surface 91 in a cross section of the filler layer 82 perpendicular to the upper surface 91. Table 1 also shows the concentration of the filler solution.

TABLE 1

| Number | Concentration [wt %] | Viscosity [cP] | Number of Revolutions [rpm] | Void Density [number/μm] |
|---|---|---|---|---|
| A1 | 25 | 7.5 | 300 | 0 |
| A2 | 10 | 3 | 300 | 0.028 |
| A3 | 20 | 5 | 800 | 0.034 |
| A4 | 30 | 12 | 1000 | 0.046 |
| A5 | 5 | 2 | 300 | 0.17 |
| A6 | 5 | 2 | 800 | 0.22 |
| A7 | 25 | 7.5 | 1500 | 0.26 |

Figures 7, 8:
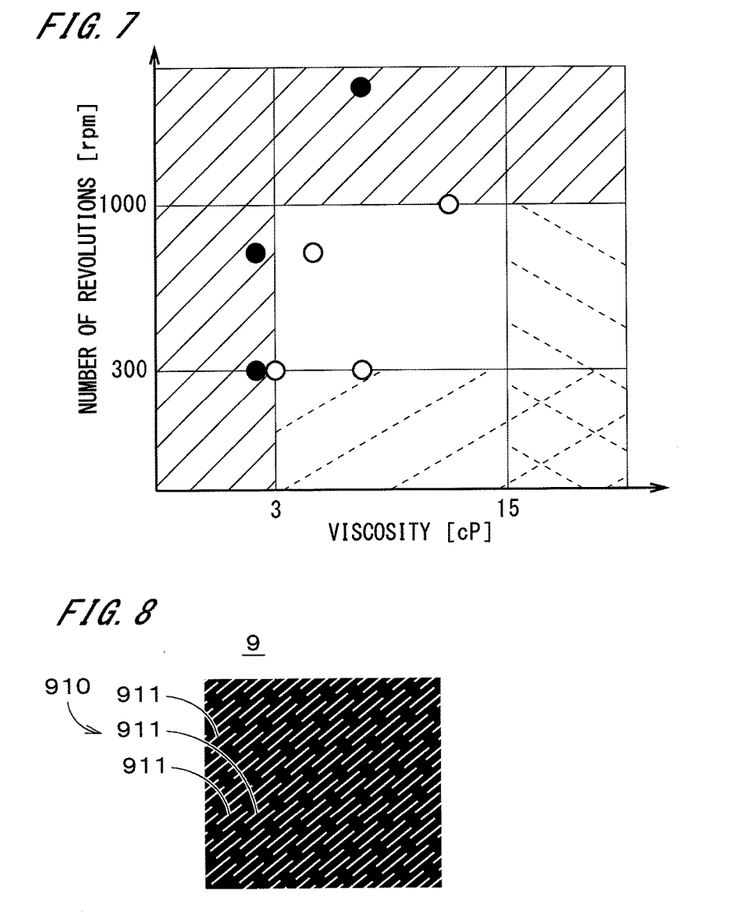
FIG. 7 illustrates a relationship between the viscosity of a filler solution, the number of revolutions of a substrate, and the presence or absence of void defects.
FIG. 8 is a plan view of a pattern on a substrate.

FIG. 7 illustrates a relationship between the viscosity of the filler solution, the number of revolutions of the substrate 9, and the presence or absence of void defects. In FIG. 7, a sample in which the number of voids 821 observable in the range of 1 μm (void density) is 0.05 or more is assumed to be a defective sample (have a void defect) and the condition of this sample is plotted with black circles, whereas a sample in which the void density is less than 0.05 is assumed to be a non-defective sample and the condition of this sample is plotted with white circles. As illustrated in FIG. 7, it can be seen that void defects having a high void density occur when the viscosity of the filler solution is less than 3 cP or when the number of revolutions of the substrate 9 is greater than 1000 rpm. In FIG. 7, the range of viscosities of the filler solution in which void defects occur and the range of the number of revolutions of the substrate 9 in which void defects occur are hatched with solid lines (the same applies to FIG. 13, which will be described later). It is considered that when the viscosity of the filler solution is less than 3 cP, the voids 821 are likely to occur due to reduced adhesion of the filler solution to the upper surface 91, and that when the number of revolutions of the substrate 9 is greater than 1000 rpm, the voids 821 are likely to occur due to the centrifugal force becoming excessively large.

As described above, after the processing using processing liquids has been performed on the upper surface 91 of the substrate 9 having the pattern 910, the liquid filling processing for filling the upper surface 91 with the filler solution is performed, in which the filler solution having a viscosity of 3 centipoises or more is first applied to the central part of the upper surface 91. The substrate 9 is then rotated at 1000 revolutions per minute or less, and as a result, the processing liquid adhering to the entire upper surface 91 is replaced by the filler solution and the solution layer 81 of a predetermined thickness is formed. In this way, the occurrence of the voids 821 in the filler layer 82 can be reduced by making the viscosity of the filler solution relatively high and making the centrifugal force acting at the time of rotation of the substrate 9 relatively low. Consequently, the deformation of the pattern elements 911 due to the occurrence of the voids 821 can be suppressed at the time of filling with the filler that uses the filler solution. In other words, the deformation of the pattern elements 911 can be suppressed by setting the viscosity of the filler solution applied to the upper surface 91 and the number of revolutions of the substrate 9 at the time of forming the solution layer 81 to conditions that suppress the occurrence of the voids 821 in the solidified solution layer (filler layer 82) (e.g., conditions that suppress the occurrence of voids 821 that bring adjacent pattern elements 911 into contact with one another).

Table 1 shows that the void densities become low when the viscosity of the filler solution is 3 cP or more and the number of revolutions of the substrate 9 is less than or equal to 1000 rpm. As is clear from Table 1, the viscosity of the filler solution is preferably, for example, 5 cP or more, and more preferably, 7.5 cP or more because the void density deceases as the viscosity of the filler solution increases. Similarly, the number of revolutions of the substrate 9 in step S14 is preferably, for example, 800 rpm or less, and more preferably, 300 rpm because the void density decreases as the number of revolutions of the substrate 9 decreases.

Incidentally, if the viscosity of the filler solution is excessively high, it is difficult to diffuse the filler solution over the entire upper surface 91 of the substrate 9 in a short period of time. In actuality, the viscosity of the filler solution is preferably 15 centipoises or less from the viewpoint of suppressing poor spread of the filler solution. If the number of revolutions of the substrate 9 is excessively low, it is difficult to reduce water in the solution layer 81 in a short period of time, and when the substrate 9 is conveyed from the cleaning unit 4 to the heat treatment unit 5, the filler solution on the upper surface 91 will be dispersed to the surroundings and soil the center robot CR and other constituent elements. From the viewpoint of making the solution layer 81 semidry to the extent that the filler solution on the upper surface 91 is not dispersed at the time of conveyance of the substrate 9, the number of revolutions of the substrate 9 in step S14 is preferably 300 revolutions per minute or more. In FIG. 7, the range in which the viscosity of the filler solution is higher than 15 cP and the range in which the number of revolutions of the substrate 9 is less than 300 rpm are each hatched with broken lines (the same applies to FIG. 13, which will be described later), excluding the range of viscosities of the filler solution in which void defects occur and the range of the number of revolutions of the substrate 9 in which void defects occur (the ranges hatched with solid lines).

Figure 9:
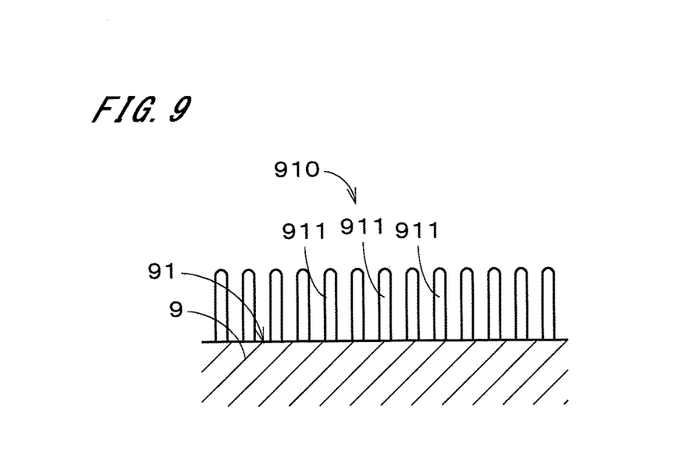
FIG. 9 is a cross-sectional view of the pattern on the substrate.

The above-described technique for suppressing the deformation of the pattern elements 911 is also usable in substrates 9 having patterns whose structure is different from the pattern in FIG. 4. FIG. 8 is a plan view of a pattern 910 on a substrate 9, and FIG. 9 is a cross-sectional view of the pattern 910 on the substrate 9. FIG. 9 illustrates a cross-section perpendicular to the upper surface 91 of the substrate 9, and hatching that indicates the cross-section of the pattern elements 911 is not shown (the same applies to FIGS. 10 and 12, which will be described later). In FIG. 8, the pattern elements 911 are indicated by white lines (the same applies to FIG. 11, which will be described later). The pattern 910 includes a large number of pattern elements 911. Each pattern element 911 stands upright on the upper surface 91 and has a height of, for example, 350 nm. As illustrated in FIG. 8, the pattern elements 911 have a narrow elongated shape when viewed in a direction perpendicular to the upper surface 91.

In liquid filling processing performed on the substrate 9 having the pattern 910 illustrated in FIGS. 8 and 9, the filler solution having a viscosity of 3 cP or more is applied to the central part of the upper surface 91 in step S13 in FIG. 3. In step S14, by rotating the substrate 9 at 1000 rpm or less, the processing liquid adhering to the entire upper surface 91 is replaced by the filler solution and a solution layer of a predetermined thickness is formed. This suppresses the deformation of the pattern elements 911 at the time of filling with the filler that uses the filler solution.

Figure 10:
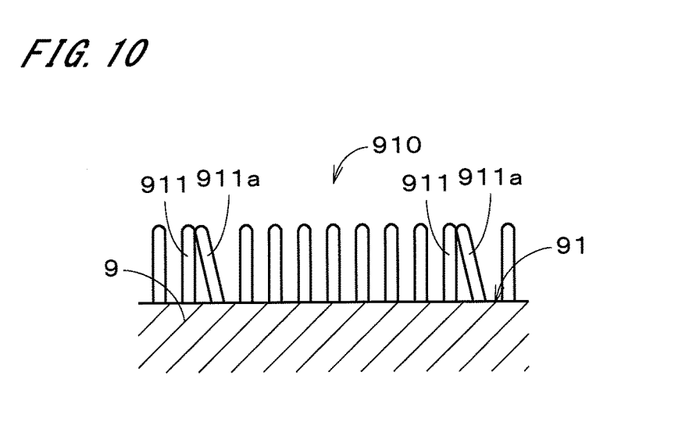
FIG. 10 is a cross-sectional view of a pattern on a substrate after the filler layer is removed.
Figure 11:
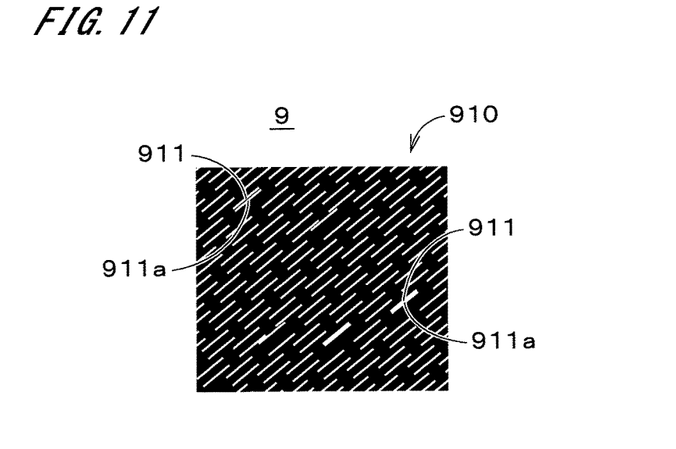
FIG. 11 is a plan view of the pattern on the substrate after the filler layer is removed.
Figure 12:
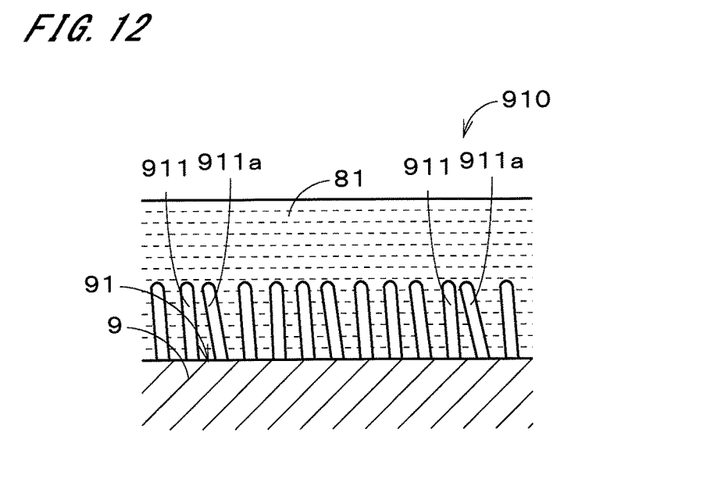
FIG. 12 illustrates the pattern and a solution layer on the substrate.

Here, if the processing according to the comparative example in which the viscosity of the filler solution applied to the substrate 9 in step S13 is less than 3 cP or the number of revolutions of the substrate 9 in step S14 is greater than 1000 rpm is performed on the substrate 9 illustrated in FIGS. 8 and 9, the pattern elements 911a after removal of the filler layer may become deformed, such as the tip end of one pattern element 911a adhering to the tip end of another adjacent pattern element 911 as illustrated in FIGS. 10 and 11. The cause of such deformation of the pattern elements 911a is not clear, but it is considered that some pattern elements 911a tilt greatly as illustrated in FIG. 12 due to the filler solution being excessively moved by the centrifugal force at the time of rotation of the substrate 9 in step S14, and accordingly the tip ends of these pattern elements 911a adhere to the tip ends of other pattern elements 911.

Table 2 shows a relationship between the viscosity of the filler solution, the number of revolutions of the substrate 9, and the density of occurrence of deformed pattern elements 911a for the substrate 9 having the pattern 910 in FIGS. 8 and 9. The density of occurrence of deformed pattern elements 911 ("Deformation Occurrence Density" in Table 2) indicates the number of deformed pattern elements 911a observable in the range of 1 μm² of the upper surface 91.

TABLE 2

| Number | Concentration [wt %] | Viscosity [cP] | Number of Revolutions [rpm] | Deformation Occurrence Density [number/μm²] |
|---|---|---|---|---|
| B1 | 25 | 7.5 | 300 | 0.18 |
| B2 | 10 | 3 | 300 | 0.71 |
| B3 | 15 | 4 | 500 | 0.34 |
| B4 | 30 | 12 | 1000 | 0.89 |

TABLE 2-continued

| Number | Concentration [wt %] | Viscosity [cP] | Number of Revolutions [rpm] | Deformation Occurrence Density [number/μm²] |
|---|---|---|---|---|
| B5 | 5 | 2 | 300 | 3.19 |
| B6 | 5 | 2 | 1000 | 13.2 |
| B7 | 25 | 7.5 | 1500 | 4.44 |

Figure 13:
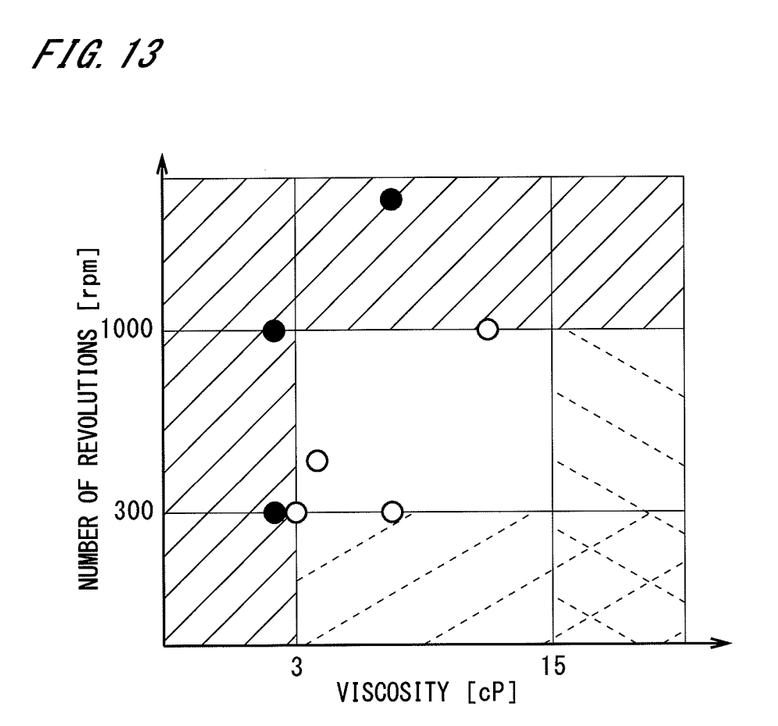
FIG. 13 illustrates a relationship between the viscosity of the filler solution, the number of revolutions of the substrate, and the presence or absence of deformation defects.

FIG. 13 illustrates a relationship between the viscosity of the filler solution, the number of revolutions of the substrate 9, and the presence or absence of deformation defects. In FIG. 13, a sample in which the number of deformed pattern elements 911a observable in the range of 1 μm² (deformation occurrence density) is 1.0 or more is assumed to be a defective sample and the condition of this sample is plotted with black circles, whereas a sample in which the deformation occurrence density is less than 1.0 is assumed to be a non-defective sample and the condition of this sample is plotted with white circles. As illustrated in FIG. 13, it can be seen that the defamation occurrence density in the substrate 9 having the pattern 910 illustrated in FIGS. 8 and 9 becomes high when the viscosity of the filler solution is less than 3 cP or when the number of revolutions of the substrate 9 is greater than 1000 rpm. That is, it can be seen that the deformation of the pattern elements 911 is suppressed when the viscosity of the filler solution is 3 cP or more and the number of revolutions of the substrate 9 is 1000 rpm or less.

From the viewpoint of more reliably suppressing the deformation of the pattern elements 911, the filler solution applied to the upper surface 91 of the substrate 9 in step S13 preferably includes a surface tension reducing agent. One example of the surface tension reducing agent is isopropyl alcohol (IPA). The filler solution including a surface tension reducing agent has a lower surface tension than filler solutions that do not include any surface tension reducing agent, and therefore has higher wettability to the upper surface 91 of the substrate 9. This suppresses excess movement of the filler solution associated with the rotation of the substrate 9 and further suppresses the deformation of the pattern elements 911.

The above-described liquid filling processing may be modified in various ways.

While the above-described embodiments describe the substrates 9 having a diameter of 300 mm, the liquid filling processing may also be usable in substrates 9 of other sizes. In the case of the substrates 9 of the other sizes, the influence of the viscosity of the filler solution on the deformation of the pattern elements 911 can be considered to be the same as in the case of the substrates 9 having a diameter of 300 mm, but the influence of the centrifugal force generated by the rotation of the substrate 9 in step S14 differs from that in the case of the substrates 9 having a diameter of 300 mm. When the conditions that suppress the influence of the centrifugal force are generalized on the basis of the conditions in the case of the substrates 9 having a diameter of 300 mm, it can be said that the substrates 9 are preferably rotated at V revolutions per minute or less in step S14 in FIG. 3, where V is the value obtained by multiplying a square root of (150/r) by 1000 and r is the radius of the substrate 9 in millimeters. Thus, it is possible to suppress the deformation of the pattern elements 911 in various sizes of substrates 9.

The filler solution that contains water as a solvent has a relatively high surface tension and thus has low adhesion to the upper surface 91. Accordingly, it can be said that the above-described technique for suppressing the deformation of the pattern elements 911 is particularly suitable for the cases of using water-based filler solutions.

While in the above-described embodiments, the upper surface 91 of the substrate 9 is filled with the filler solution after the rinse processing using the rinse liquid, which is part of the cleaning processing, the filling with the filler solution may be performed after various types of processing (e.g., etching processing) other than the cleaning processing. Depending on the design of the substrate processing apparatus 1, the baking of the substrate 9 in step S15 may be performed by an external apparatus.

The substrates to be processed by the substrate processing apparatus 1 are not limited to semiconductor substrates and may, for example, be glass substrates or other substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2015-99566 filed in the Japan Patent Office on May 15, 2015, the entire disclosure of which is incorporated herein by reference.

REFERENCE SIGNS LIST

9 Substrate
81 Solution layer
82 Filler layer
91 Upper surface
821 Void
910 Pattern
911, 911a Pattern element
912 Bridge
S11 to S15 Step

The invention claimed is:

1. A filler layer forming method for filling a main surface of a substrate having a pattern formed thereon with a filler solution after said main surface has been processed using a processing liquid, to form a filler layer, the method comprising:
   a) applying a filler solution having a viscosity of three centipoises or more to a central part of a main surface of a substrate, said main surface having a large number of pattern elements that stand upright;
   b) replacing a processing liquid that adheres to an entirety of said main surface with said filler solution and forming a solution layer of a predetermined thickness by rotating said substrate at V revolutions per minute or less, where V is a value obtained by multiplying a square root of (150/r) by 1000 and r is a radius of said substrate in millimeters; and
   c) baking said substrate to solidify said solution layer and form a filler layer.

2. The filler layer forming method according to claim 1, wherein
said filler solution contains water as a solvent.

3. The filler layer forming method according to claim 1, wherein
said filler solution contains a surface tension reducing agent.

4. The filler layer forming method according to claim 3, wherein
said surface tension reducing agent is isopropyl alcohol.

5. The filler layer forming method according to claim 1, wherein
said filler solution has a viscosity of 15 centipoises or less.

6. The filler layer forming method according to claim 1, wherein
the number of revolutions of said substrate in said operation b) is 300 revolutions per minute or more.

7. The filler layer forming method according to claim 1, wherein
tip ends of pattern elements that are adjacent to each other among said large number of pattern elements are coupled to each other by a bridge that extends along said main surface.

8. A filler layer forming method for filling a main surface of a substrate having a pattern formed thereon with a filler solution after said main surface has been processed using a processing liquid, to form a filler layer, the method comprising:
   a) applying a filler solution to a central part of a main surface of a substrate, said main surface having a large number of patter elements that stand upright;
   b) replacing a processing liquid that adheres to an entirety of said main surface with said filler solution and forming a solution layer of a predetermined thickness by rotating said substrate; and
   c) baking said substrate to solidify said solution layer and form a filler layer,
   wherein a viscosity of said filler solution applied in said operation a) and a number of revolutions of said substrate in said operation b) are set to conditions that suppress occurrence of a void in said filler layer.

9. The filler layer forming method according to claim 8, wherein
said filler solution contains water as a solvent.

10. The filler layer forming method according to claim 8, wherein
said filler solution contains a surface tension reducing agent.

11. The filler layer forming method according to claim 10, wherein
said surface tension reducing agent is isopropyl alcohol.

12. The filler layer forming method according to claim 8, wherein
said filler solution has a viscosity of 15 centipoises or less.

13. The filler layer forming method according to claim 8, wherein
the number of revolutions of said substrate in said operation b) is 300 revolutions per minute or more.

14. The filler layer forming method according to claim 8, wherein
tip ends of pattern elements that are adjacent to each other among said large number of pattern elements are coupled to each other by a bridge that extends along said main surface.

* * * * *